United States Patent
Wu et al.

(10) Patent No.: US 11,286,386 B1
(45) Date of Patent: Mar. 29, 2022

(54) CIRCUIT BUILD-UP FILM FOR WAFER-LEVEL PACKAGING, AND FABRICATION METHOD AND USE THEREOF

(71) Applicant: WUHAN CHOICE TECHNOLOGY CO., LTD., Wuhan (CN)

(72) Inventors: De Wu, Wuhan (CN); Shuhang Liao, Wuhan (CN); Yi Wang, Wuhan (CN); Junxing Su, Wuhan (CN); Feifei Liang, Wuhan (CN)

(73) Assignee: WUHAN CHOICE TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/509,175

(22) Filed: Oct. 25, 2021

Related U.S. Application Data

(63) Continuation of application No. PCT/CN2021/073213, filed on Jan. 22, 2021.

(30) Foreign Application Priority Data

Jan. 15, 2021 (CN) .......................... 202110052151.1

(51) Int. Cl.
*C08L 63/00* (2006.01)
*C08J 5/18* (2006.01)
(Continued)

(52) U.S. Cl.
CPC ................. *C08L 63/00* (2013.01); *C08J 5/18* (2013.01); *H01L 21/561* (2013.01);
(Continued)

(58) Field of Classification Search
CPC ........ C08L 63/00–10; C09D 163/00–10; C09J 163/00–10; C08J 2363/00–10;
(Continued)

(56) References Cited

U.S. PATENT DOCUMENTS

2010/0280151 A1  11/2010  Nguyen et al.

FOREIGN PATENT DOCUMENTS

| CN | 1282105 A | 1/2001 |
| CN | 101475685 A | 7/2009 |

(Continued)

OTHER PUBLICATIONS

Standard Test Method for Linear Thermal Expansion of Solid Materials by Thermomechanical Analysis, ASTM International, Designation: E831-19, pp. 1-5.

(Continued)

*Primary Examiner* — Kregg T Brooks
(74) *Attorney, Agent, or Firm* — Bayramoglu Law Offices LLC

(57) ABSTRACT

A circuit build-up film for wafer-level packaging (WLP) includes 40 to 60 parts by mass of a first epoxy resin, 15 to 30 parts by mass of a second epoxy resin, 25 to 50 parts by mass of a curing agent, 0.1 to 5 parts by mass of a curing accelerator, 5 to 20 parts by mass of an additive, 320 to 650 parts by mass of an inorganic filler, and 0.01 to 5 parts by mass of a silane coupling agent (SCA), where the additive is obtained by subjecting an epoxy resin to a reaction with a polyhydroxyl-terminated dendritic crosslinking agent. The build-up film shows prominent fluidity during heating and curing, and can completely fill gaps among wafers. A packaging process using the build-up film is simple. Regardless of the number of wafers, packaging can be completed through one procedure with the build-up film.

20 Claims, 1 Drawing Sheet

(51) Int. Cl.
*H01L 21/56* (2006.01)
*H01L 23/29* (2006.01)

(52) U.S. Cl.
CPC ......... *H01L 23/295* (2013.01); *C08J 2363/02* (2013.01); *C08J 2461/06* (2013.01); *C08J 2463/02* (2013.01); *C08L 2203/16* (2013.01); *C08L 2203/206* (2013.01); *C08L 2205/025* (2013.01); *C08L 2205/035* (2013.01); *C08L 2312/00* (2013.01)

(58) Field of Classification Search
CPC ... H01L 23/293; H01L 23/295; H01L 21/561; H01L 33/56; C08G 73/028
See application file for complete search history.

(56) References Cited

FOREIGN PATENT DOCUMENTS

| | | |
|---|---|---|
| CN | 102112516 A | 6/2011 |
| CN | 104403087 A | 3/2015 |
| CN | 107778774 A | 3/2018 |
| CN | 109233211 A | 1/2019 |
| CN | 109486100 A | 3/2019 |
| CN | 109971127 A | 7/2019 |
| CN | 110997765 A | 4/2020 |
| CN | 111909486 A | 11/2020 |
| JP | 2007314740 A | 12/2007 |

OTHER PUBLICATIONS

Standard Test Method for Storage Modulus Calibration of Dynamic Mechanical Analyzers, ASTM International, Designation: E2254-18, pp. 1-4.

D. Ratna, et al., Thermal and Mechanical Properties of a Hydroxyl-functional Dendritic Hyperbranched Polymer and Trifunctional Epoxy Resin Blends, Polymer Engineering And Science, Oct. 2001, pp. 1815-1822, vol. 41, No. 10.

D. Manjula Dhevi, et al., Studies on the toughening of epoxy resin modified with varying hyperbranched polyester-toluene diisocyanate content, Journal of Polymer Research, 2014, 21.

CIRCUIT BUILD-UP FILM FOR WAFER-LEVEL PACKAGING, AND FABRICATION METHOD AND USE THEREOF

CROSS REFERENCE TO THE RELATED APPLICATIONS

This application is the Continuation Application of International Application No. PCT/CN2021/073213, filed on Jan. 22, 2021, which is based upon and claims priority to Chinese Patent Application No. 202110052151.1, filed on Jan. 15, 2021, the entire contents of which are incorporated herein by reference.

TECHNICAL FIELD

The present disclosure belongs to the technical field of wafer-level chip packaging, and specifically relates to a circuit build-up film for wafer-level packaging (WLP), and a fabrication method and use thereof.

BACKGROUND

The hot-selling mobile electronic communication products such as smart phones and tablet computers promote the sales market of various electronic components. Moreover, as electronic communication products have increasingly powerful functions, people have more requirements on lightness, thinness, long standby time, Internet speed, start up or shutdown speed, and the like, which presents advanced requirements on a processor and requires more signal pins to achieve advanced functions. Therefore, a corresponding flip-chip IC substrate and packaging technology are very important. In addition, due to the continuous development of semiconductor fabrication processes, it is supposed that processors of 5G mobile communication products tend to use advanced flip-chip packaging technology.

At present, high-end flip-chip IC substrates made by using a circuit build-up film and fan-out packaging are mainly used for large chips such as CPU, GPU, field programmable gate array (FPGA), and network processor (NP). In recent years, the demand for high-performance computing (HPC) related to artificial intelligence (AI) and self-driving has exploded. In the new generation, 10/7 nm HPC chips or application specific integrated circuits (ASICs) such as cryptocurrency mining computing and block chains are adopted, and package substrates made by circuit build-up film are also massively used in packaging processes.

However, the existing chips are typically packaged through a liquid epoxy resin. When an object to be packaged has a large size, the liquid epoxy resin is difficult to well encapsulate the object to be packaged. In addition, a large size of an object to be packaged also presents advanced requirements on the fluidity and warpage of an epoxy resin composition. Current epoxy resin packaging materials and packaging methods are not suitable for large-size WLP.

SUMMARY

The present disclosure is intended to provide a circuit build-up film for WLP, and a fabrication method and use thereof. The circuit build-up film is suitable for large-scale WLP.

The circuit build-up film for WLP provided by the present disclosure includes the following components:

| | |
|---|---|
| a first epoxy resin | 40 to 60 parts by mass; |
| a second epoxy resin | 15 to 30 parts by mass; |
| a curing agent | 25 to 50 parts by mass; |
| a curing accelerator | 0.1 to 5 parts by mass; |
| an additive | 5 to 20 parts by mass; |
| an inorganic filler | 320 to 650 parts by mass; |
| a silane coupling agent (SCA) | 0.01 to 5 parts by mass; | where the first epoxy resin is one or more from the group consisting of a bisphenol A epoxy resin, a bisphenol F epoxy resin, and a biphenyl epoxy resin;

the second epoxy resin is one or two from the group consisting of a naphthalene epoxy resin and a dicyclopentadiene-phenol epoxy resin; and the additive is obtained by subjecting an epoxy resin to a reaction with a polyhydroxyl-terminated dendritic crosslinking agent at 100° C. to 160° C. for 2 h to 4 h, where an amount of the dendritic crosslinking agent is 1% to 5% of an amount of the epoxy resin, and the epoxy resin may preferably be a bisphenol A epoxy resin or a bisphenol F epoxy resin.

The dendritic crosslinking agent is a highly-branched dendrimer with a spherical structure. The dendritic crosslinking agent used in the present disclosure includes polyhydroxyl at an end, and the polyhydroxyl at the end undergoes a ring-opening reaction with an epoxy group of the epoxy resin to obtain an epoxy-modified dendritic additive. The additive has prominent compatibility with the epoxy resin curing system, and can multidimensionally participate in a crosslinking reaction of the system, change a crosslinking structure of the system, and effectively improve the comprehensive mechanical properties of the system, thereby improving a flexural strength and a stress and reducing a warpage for the circuit build-up film.

The polyhydroxyl-terminated dendritic crosslinking agent may be a hydroxyl-terminated polyamidoamine (PAMAM) dendrimer, and may specifically be the T60 product of Weihai Chenyuan Molecular New Material Co., Ltd.

Further, when the second epoxy resin is two from the group consisting of the naphthalene epoxy resin and the dicyclopentadiene-phenol epoxy resin, the naphthalene epoxy resin may account for 5 to 10 parts by mass and the dicyclopentadiene-phenol epoxy resin may account for 15 to 25 parts by mass.

Further, the curing agent may be one or more from the group consisting of an amine curing agent, a mercaptan curing agent, an anhydride curing agent, and a phenolic resin curing agent, and may preferably be a phenolic resin curing agent.

Preferably, the curing accelerator may be an imidazole curing accelerator.

Preferably, the inorganic filler may be silica.

Preferably, the SCA may be γ-glycidoxypropyltrimethoxysilane.

The circuit build-up film may further include 0.1 to 5 parts of a colorant, and the colorant is merely used to provide a color for the circuit build-up film.

The fabrication method of the circuit build-up film for WLP provided by the present disclosure includes:

mixing the first epoxy resin, the second epoxy resin, the curing agent, the curing accelerator, the additive, the inorganic filler, and the SCA in a specified ratio; and coating a resulting mixture slurry on a base film, and drying the film.

The circuit build-up film for WLP can be used for packaging a semiconductor mounting structure, and the semiconductor mounting structure includes a substrate and a plurality of wafers arranged on the substrate.

A specific use method includes: covering wafers with the circuit build-up film, and heating and curing to achieve filling and packaging.

Compared with the prior art, the present disclosure has the following characteristics and beneficial effects.

(1) The circuit build-up film of the present disclosure shows prominent fluidity during heating and curing, can completely fill gaps among wafers, and achieves both filling and packaging.

(2) A cured circuit build-up film has a low coefficient of thermal expansion (CTE), high storage modulus, and low warpage, which can reduce cracks of a packaged object in the subsequent process and use, thereby improving the product quality of the packaged object.

(3) A packaging process using the circuit build-up film of the present disclosure is simple. Regardless of the number of wafers arranged on a substrate of a semiconductor mounting structure, packaging can be completed through one procedure with the circuit build-up film of the present disclosure.

Figure 1:
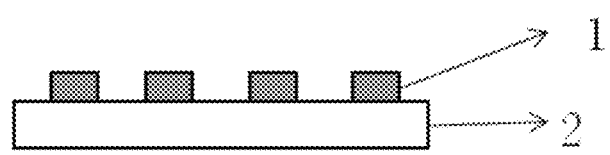
FIG. 1 is a schematic diagram of a semiconductor mounting structure to be packaged.

Reference numerals in the figures: 1: wafer, 2: substrate, and 3: circuit build-up film.

DETAILED DESCRIPTION OF THE EMBODIMENTS

In order to make the objectives, technical solutions, and advantages of the present disclosure more comprehensible, specific implementations of the present disclosure are described in further detail below. It should be understood that the specific implementations described are merely intended to explain the present disclosure, rather than to limit the present disclosure.

The circuit build-up film for WLP provided by the present disclosure includes an epoxy resin, 25 to 50 parts by mass of a curing agent, 0.1 to 5 parts by mass of a curing accelerator, 5 to 20 parts by mass of an additive, 320 to 650 parts by mass of an inorganic filler, and 0.01 to 5 parts by mass of an SCA, where the epoxy resin includes 40 to 60 parts by mass of a first epoxy resin and 15 to 30 parts by mass of a second epoxy resin; the first epoxy resin is one or more from the group consisting of a bisphenol A epoxy resin, a bisphenol F epoxy resin, and a biphenyl epoxy resin, and is preferably a bisphenol A epoxy resin; and the second epoxy resin is one or two from the group consisting of a naphthalene epoxy resin and a dicyclopentadiene-phenol epoxy resin.

The additive is an epoxy-modified dendritic crosslinking agent and is obtained by subjecting an epoxy resin to a reaction with a polyhydroxyl-terminated dendritic crosslinking agent at 100° C. to 160° C. for 2 h to 4 h, during which hydroxyl in the dendritic crosslinking agent opens a ring of epoxy. The parts by mass of the dendritic crosslinking agent may be 1% to 5% of the parts by mass of the epoxy resin. In this specific implementation, 100 parts by mass of a bisphenol F epoxy resin are subjected to a reaction with 5 parts by mass of a polyhydroxyl-terminated dendritic crosslinking agent, and the polyhydroxyl-terminated dendritic crosslinking agent may be the T60 product purchased from Weihai Chenyuan Molecular New Material Co., Ltd.

The curing agent may be any curing agent corresponding to an epoxy resin used, and is not particularly limited. As required, the curing agent may be one or more from the group consisting of an amine curing agent, a mercaptan curing agent, an anhydride curing agent, and a phenolic resin curing agent. In this specific implementation, a phenolic resin curing agent is adopted. The curing accelerator can be any conventional curing accelerator, and is also not particularly limited. In this specific implementation, an imidazole curing accelerator is adopted. The curing accelerator can be used at a conventional amount. The inorganic filler can be a conventional inorganic filler, such as silica, calcium silicate, and boron nitride. The SCA is located between an inorganic interface and an organic interface, and can form a bonding layer of organic matrix-SCA-inorganic matrix at an interface, which plays the role of connecting materials with many different properties. The SCA may preferably be γ-glycidoxypropyltrimethoxysilane. The circuit build-up film of the present disclosure may further include 0.1 to 5 parts by mass of a colorant, and the colorant is used to provide a color for the circuit build-up film. Specifically, a pigment such as carbon black can be used. The colorant is a non-essential component.

The circuit build-up film of the present disclosure can be fabricated by a film coating process: mixing the mixed epoxy resin, the curing agent, the curing accelerator, the additive, the inorganic filler, and the SCA in a specified ratio; and coating a resulting mixture slurry on a base film with a film coating machine, and drying the film to obtain the circuit build-up film of the present disclosure. In a specific implementation, the base film is generally a PET film.

Figure 2:
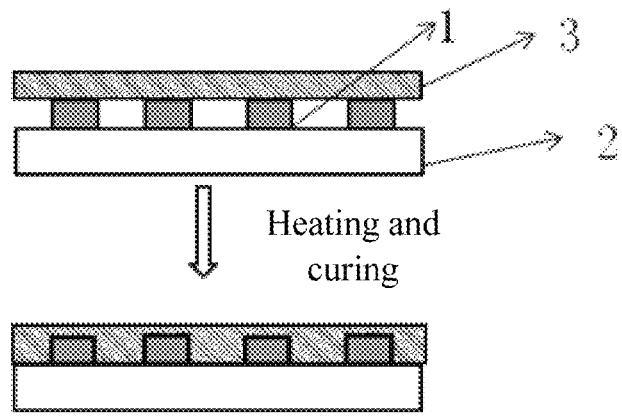
FIG. 2 is a schematic diagram of the use of the circuit build-up film according to the present disclosure.

As shown in FIG. 1 and FIG. 2, the circuit build-up film of the present disclosure can be used for packaging the semiconductor mounting structure shown in FIG. 1. The semiconductor mounting structure includes a substrate 2 and a plurality of wafers 1 arranged on the substrate 2. During the packaging, the wafers 1 need to be covered and gaps among the wafers 1 need to be filled. Use method: with reference to FIG. 2, the wafers 1 of the semiconductor mounting structure are covered with the circuit build-up film, and then the circuit build-up film is then heated and cured at 120° C. for 5 min. Because the circuit build-up film of the present disclosure shows prominent fluidity during heating and curing, the circuit build-up film 3 can completely fill gaps among the wafers. Moreover, a cured circuit build-up film also has the characteristics of low CTE, high storage modulus, and low warpage. Regardless of the number of wafers 1 arranged on the substrate 2 of the semiconductor mounting structure, packaging can be completed through one procedure with the circuit build-up film of the present disclosure, which can greatly simplify a packaging process of multiple wafers.

In order to further prove the advantages of the circuit build-up film of the present disclosure, the following comparison test was conducted. In the following examples and comparative examples, a phenolic resin was used as a curing agent, 2-phenylimidazole was used as a curing accelerator, silica was used as an inorganic filler, carbon black was used as a colorant, and γ-glycidoxypropyltrimethoxysilane was used as an SCA.

Formulas of the examples and comparative examples were shown in Table 1. Products obtained in the examples and comparative examples were tested for CTE1/2, storage modulus, and warpage, and test data were shown in Table 1.

In this implementation, the CTE1/2 was tested as follows: the prepared circuit build-up films were stacked to a thickness of 1.2 mm, and then heated and cured at 180° C. for 1 h, and then the ASTME831-2019 standard method was used to test CTE;

the storage modulus was tested as follows: the prepared circuit build-up films were stacked to a thickness of 1.2 mm, and then heated and cured at 180° C. for 1 h, and then the ASTME2254-2018 standard method was used to test the storage modulus;

the warpage was tested as follows: the prepared circuit build-up film was applied on a 0.1 mm-thick round glass slide and then baked at 130° C. for 1 h, and after the round glass slide was cooled, an upturn height of the circuit build-up film on both sides of the round glass slide was tested, which was the warpage;

the fluidity was tested as follows: a square circuit build-up film with a size of 5 mm×5 mm was taken and sandwiched with a copper sheet, and then baked at 120° C. for 5 min, and then a flow distance of the circuit build-up film on the copper sheet was observed, where if the flow distance is higher than 2 mm, it indicates that the fluidity is prominent, which is denoted as ⊚; and if the flow distance is less than 2 mm, it indicates that the fluidity is poor, which is denoted as x; and the tensile strength was tested as follows: a circuit build-up film with a size of 200 mm×10 mm was taken and tested with a universal tensile testing machine, a maximum load when the circuit build-up film broke was recorded, and then the tensile strength was calculated according to the formula: tensile strength=maximum load/breaking cross-sectional area.

It can be seen from Table 1 that the circuit build-up film of the present disclosure has low CTE, high storage modulus, and small warpage, which will reduce or even avoid the cracking, warping, and other negative phenomena of wafers during the subsequent process and use. The circuit build-up film of the present disclosure has prominent fluidity, which helps to completely fill gaps among wafers.

The addition of the additive with a dendritic main structure can improve a material system structure and make the circuit build-up film have more stable comprehensive mechanical properties. It can be seen from Table 1 that, compared with Comparative Examples 1 and 2, for the circuit build-up film of the present disclosure, the CTE is significantly reduced; the storage modulus is significantly improved, where the storage modulus of Example 4 is increased by about 50%; the warpage is reduced by nearly half at most; the tensile strength is also improved, where the tensile strength of Example 1 is increased by 90%, indicating a significant improvement effect; and the circuit build-up film of the present disclosure also has excellent fluidity. The CTE, storage modulus (to characterize the elasticity of a material), warpage, and fluidity all are external manifestations of an internal stress of a system material, and the tensile strength is the characterization of external mechanical properties of a material. Therefore, the test data in Table 1 prove that the comprehensive mechanical properties of the circuit build-up film of the present disclosure have been significantly improved.

The above example is only one among various examples. Changes or modifications in different forms can be made by those skilled in the art on the basis of the above description, and these changes or modifications derived from the essential spirit of the present disclosure still belong to the protection scope of the present disclosure.

What is claimed is:

1. A circuit build-up film for wafer-level packaging (WLP), comprising the following components:
    a first epoxy resin of 40 to 60 parts by mass,
    a second epoxy resin of 15 to 30 parts by mass,
    a curing agent of 25 to 50 parts by mass,
    a curing accelerator of 0.1 to 5 parts by mass,
    an additive of 5 to 20 parts by mass,
    an inorganic filler of 320 to 650 parts by mass, and
    a silane coupling agent (SCA) of 0.01 to 5 parts by mass,

TABLE 1

Formulas and test results of the examples and comparative examples

| | Example 1 | Example 2 | Example 3 | Example 4 | Comparative Example 1 | Comparative Example 2 |
|---|---|---|---|---|---|---|
| Bisphenol A epoxy resin | 50 parts by mass | 40 parts by mass | 50 parts by mass | 60 parts by mass | 75 parts by mass | 60 parts by mass |
| Naphthalene epoxy resin | 20 parts by mass | — | 10 parts by mass | 5 parts by mass | — | 5 parts by mass |
| Dicyclopentadiene-phenol epoxy resin | — | 15 parts by mass | 15 parts by mass | 25 parts by mass | — | 25 parts by mass |
| Phenolic resin | 30 parts by mass | 25 parts by mass | 30 parts by mass | 50 parts by mass | 40 parts by mass | 50 parts by mass |
| 2-phenylimidazole | 2 parts by mass | 2 parts by mass | 2 parts by mass | 2 parts by mass | 2 parts by mass | 2 parts by mass |
| Additive | 15 parts by mass | 20 parts by mass | 5 parts by mass | 10 parts by mass | — | — |
| Silica | 550 parts by mass | 320 parts by mass | 500 parts by mass | 650 parts by mass | 600 parts by mass | 650 parts by mass |
| Carbon black | 1 parts by mass | 1 parts by mass | 1 parts by mass | 1 parts by mass | 1 parts by mass | 1 parts by mass |
| γ-glycidoxypropyl-trimethoxysilane | 3 parts by mass | 3 parts by mass | 3 parts by mass | 3 parts by mass | 3 parts by mass | 3 parts by mass |
| CTE1/2 (unit: ppm/° C.) | 10/25 | 11/30 | 10/27 | 9/25 | 28/77 | 25/70 |
| Storage modulus (unit: GPa) | 11 | 10 | 11 | 12 | 7 | 8 |
| Warpage (unit: mm) | 1.5 | 1.3 | 1.3 | 1.4 | 2.6 | 2.4 |
| Fluidity | ⊚ | ⊚ | ⊚ | ⊚ | x | x |
| Tensile strength (MPa) | 2.3 | 1.9 | 1.8 | 2.1 | 1.1 | 1.2 | wherein the first epoxy resin is one or more from the group consisting of a bisphenol A epoxy resin, a bisphenol F epoxy resin, and a biphenyl epoxy resin;

the second epoxy resin is one or two from the group consisting of a naphthalene epoxy resin and a dicyclopentadiene-phenol epoxy resin; and the additive is obtained by subjecting a bisphenol A epoxy resin or a bisphenol F epoxy resin to a reaction with a polyhydroxyl-terminated dendritic crosslinking agent at 100° C. to 160° C. for 2 h to 4 h, wherein an amount of the polyhydroxyl-terminated dendritic crosslinking agent is 1% to 5% by mass of an amount of the epoxy resin used in the reaction, the polyhydroxyl-terminated dendritic crosslinking agent is a hydroxyl-terminated polyamidoamine (PAMAM) dendrimer.

2. The circuit build-up film for the WLP according to claim 1, wherein when the second epoxy resin is two from the group consisting of the naphthalene epoxy resin and the dicyclopentadiene-phenol epoxy resin, the naphthalene epoxy resin accounts for 5 to 10 parts by mass and the dicyclopentadiene-phenol epoxy resin accounts for 15 to 25 parts by mass.

3. The circuit build-up film for the WLP according to claim 1, wherein the curing agent is one or more from the group consisting of an amine curing agent, a mercaptan curing agent, an anhydride curing agent, and a phenolic resin curing agent.

4. The circuit build-up film for the WLP according to claim 1, wherein the curing accelerator is an imidazole curing accelerator.

5. The circuit build-up film for the WLP according to claim 1, wherein the inorganic filler is silica.

6. The circuit build-up film for the WLP according to claim 1, wherein the SCA is γ-glycidoxypropyltrimethoxysilane.

7. The circuit build-up film for the WLP according to claim 1, further comprising: 0.1 to 5 parts by mass of a colorant.

8. A fabrication method of the circuit build-up film for the WLP according to claim 1, comprising:

mixing the first epoxy resin, the second epoxy resin, the curing agent, the curing accelerator, the additive, the inorganic filler, and the SCA in a specified ratio; and coating a resulting mixture slurry on a base film, and drying the base film.

9. The fabrication method according to claim 8, wherein when the second epoxy resin is two from the group consisting of the naphthalene epoxy resin and the dicyclopentadiene-phenol epoxy resin, the naphthalene epoxy resin accounts for 5 to 10 parts by mass and the dicyclopentadiene-phenol epoxy resin accounts for 15 to 25 parts by mass.

10. The fabrication method according to claim 8, wherein the curing agent is one or more from the group consisting of an amine curing agent, a mercaptan curing agent, an anhydride curing agent, and a phenolic resin curing agent.

11. The fabrication method according to claim 8, wherein the curing accelerator is an imidazole curing accelerator.

12. The fabrication method according to claim 8, wherein the inorganic filler is silica.

13. The fabrication method according to claim 8, wherein the SCA is γ-glycidoxypropyltrimethoxysilane.

14. Use of the circuit build-up film for the WLP according to claim 1, comprising:

covering wafers of a semiconductor mounting structure with the circuit build-up film, and heating and curing the circuit build-up film to fill and package the semiconductor mounting structure, wherein the semiconductor mounting structure comprises a substrate and a plurality of wafers arranged on the substrate.

15. The use according to claim 14, wherein when the second epoxy resin is two from the group consisting of the naphthalene epoxy resin and the dicyclopentadiene-phenol epoxy resin, the naphthalene epoxy resin accounts for 5 to 10 parts by mass and the dicyclopentadiene-phenol epoxy resin accounts for 15 to 25 parts by mass.

16. The use according to claim 14, wherein the curing agent is one or more from the group consisting of an amine curing agent, a mercaptan curing agent, an anhydride curing agent, and a phenolic resin curing agent.

17. The use according to claim 14, wherein the curing accelerator is an imidazole curing accelerator.

18. The use according to claim 14, wherein the inorganic filler is silica.

19. The use according to claim 14, wherein the SCA is γ-glycidoxypropyltrimethoxysilane.

20. The use according to claim 14, wherein the circuit build-up film further comprises: 0.1 to 5 parts by mass of a colorant.

* * * * *